(12) United States Patent
Slafer

(10) Patent No.: US 9,079,349 B2
(45) Date of Patent: Jul. 14, 2015

(54) METHODS FOR FORMING PATTERNS ON CURVED SURFACES

(71) Applicant: W. Dennis Slafer, Arlington, MA (US)

(72) Inventor: W. Dennis Slafer, Arlington, MA (US)

(73) Assignee: MicroContinuum, Inc., Cambridge, MA (US)

( * ) Notice: Subject to any disclaimer, the term of this patent is extended or adjusted under 35 U.S.C. 154(b) by 0 days.

(21) Appl. No.: 14/463,069

(22) Filed: Aug. 19, 2014

(65) Prior Publication Data

US 2015/0048048 A1      Feb. 19, 2015

Related U.S. Application Data

(60) Provisional application No. 61/867,433, filed on Aug. 19, 2013.

(51) Int. Cl.
| | |
|---|---|
| *B29D 11/00* | (2006.01) |
| *B29C 59/00* | (2006.01) |
| *B29C 59/02* | (2006.01) |
| *B29L 11/00* | (2006.01) |
| *B29K 101/00* | (2006.01) |

(52) U.S. Cl.
CPC ............ *B29C 59/00* (2013.01); *B29C 59/02* (2013.01); *B29D 11/00* (2013.01); *B29K 2101/00* (2013.01); *B29L 2011/0016* (2013.01)

(58) Field of Classification Search
CPC ........................ B29C 59/00; B29D 11/0073
USPC .......................................................... 216/26
See application file for complete search history.

(56) References Cited

U.S. PATENT DOCUMENTS

2006/0208374 A1*   9/2006   Shimotsuma et al. ......... 264/1.7

\* cited by examiner

*Primary Examiner* — Roberts Culbert
(74) *Attorney, Agent, or Firm* — McDermott Will and Emery LLP

(57) ABSTRACT

Methods are disclosed by which two-dimensional and three-dimensional pattern layers may be formed on non-planar surfaces, including optical elements such as lenses with one or more cylindrical, spherical or aspheric surfaces. Patterns with features in the micro- and/or nano-size regime comprised of organic, inorganic or metallic materials may be formed by the methods described herein.

19 Claims, 18 Drawing Sheets

METHODS FOR FORMING PATTERNS ON CURVED SURFACES

RELATED APPLICATION

This application claims the benefit of U.S. Provisional Application No. 61/867,433, entitled "METHODS FOR FORMING PATTERNS ON CURVED SURFACES," filed Aug. 19, 2013, the entire content of which is incorporated herein by reference.

BACKGROUND

It is known that the performance of refractive optical elements may be improved or modified by the addition of micro- or nanostructures to one or more surfaces. For example, the quality of an inexpensive molded plastic or glass lens can be improved by the addition of a diffractive or binary optical layer that can correct aberrations, provide diffusion, beam shaping, beam-splitting or diffractive capabilities, or other wavefront corrections or modifications. In addition, biomimetic 3D patterns, such as motheye antireflection structures, can be formed on lenses to reduce surface reflections and glint.

Various well-known methods have been developed over the years to form micro- and nanoscale features on flat surfaces, including photolithography, molding, direct writing, nanoimprinting, etc., but these approaches are generally not readily applicable to curves surfaces, in particular to concave, convex and aspheric lenses. Techniques that are used, such as, for example, laser interferometry, are time consuming, expensive, and limited to periodic patterns that can be formed by interferometry. Once the pattern is formed (typically in photoresist), subsequent chemical or plasma etching, followed by liftoff, are required to transfer the pattern into the lens surface. These and other approaches do not lend themselves to high volume, low cost production, nor are they flexible in terms of their ability to rapidly change patterns or lens sizes and/or curvatures.

Thus there is a need for methods and systems by which the above shortcomings and limitations of the prior art of forming patterns on curved surfaces can be remedied.

SUMMARY

The present invention provides remedies to these shortcomings, noted previously for the prior art, by providing methods and systems for the rapid, low-cost formation of precision patterns on curved surfaces, such as lenses, in order to improve the performance and functionality of these structures.

In the most general case of this invention, a method provides a desired pattern is formed on the curved surface of a substrate ("structured surface") by causing a patterned stretchable elastomeric film to conform to the curved surface of a substrate and then either bonding the elastomeric film to the substrate with the pattern facing outward or using the patterned elastomeric film as an imprint stamp (mold) with the pattern facing inward (toward substrate) to form a replica from the mold pattern on the surface of the substrate using any one of several pattern replication techniques, including radiation, thermal or chemical imprinting. These patterns can serve as refractive or diffractive optical elements to enhance the performance of the substrate, such as forming a motheye anti-reflection structure on one or more lens surfaces, adding binary or Fresnel optical layers to correct aberrations, for light control or to add functionality, incorporating diffractive or holographic structures for spectroscopic, beam steering, projected images, or even security applications, etc. The invention also allows the formation of conformal resist masks on such compound curved surfaces, which when combined with the lithographic techniques of additive and subtractive processing enables the formation of metal, alloy, dielectric or multi-layer patterns on these surfaces. These metal and/or dielectric patterns have broad applicability, such as for incorporating electrical circuitry (transparent conductive metal grids, touch screen patterns, thin-film transistors, etc.), metamaterials (for light signature/radiation control), photovoltaic, etc. It is also possible to combine these two types of patterns on one or more curved surfaces of a substrate, such as a periodic nanoarray for light control with a metal grid as a transparent conductive surface, etc.

DETAILED DESCRIPTION

Figure 1:
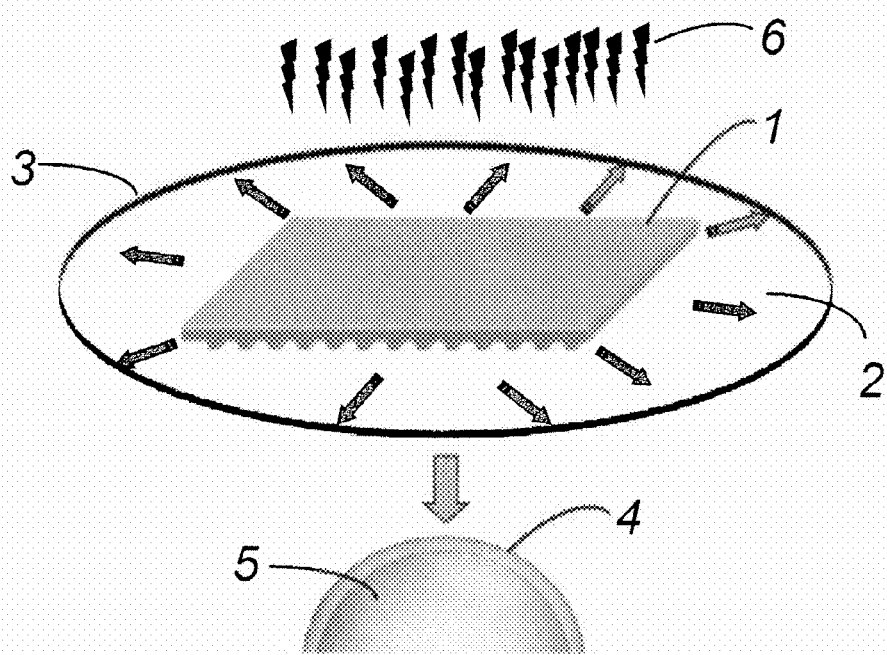
FIG. 1 depicts elastomeric molding film prior to pattern replication on surface on substrate with compound curvature.

In a first embodiment, an example of which is shown in FIG. 1, an optical element, such as a motheye antireflective pattern, consisting of an array of submicron sized tall conical shapes, is formed directly onto the curved surface of a concave lens using a stretchable elastomeric mold. The mold pattern, which is complementary to the desired pattern, is formed on one surface of an elastomeric film 1. This can be done by forming the mold pattern directly into the surface of the film, by known thermal or chemical/solvent imprinting means. In another embodiment, the stretchable elastomeric patterning mold is formed as a composite (multilayer) film in which the mold pattern is formed as a layer on a stretchable elastomeric support film. The mold layer is formed by the known means of radiation curing, or thermal or chemical molding.

The elastomeric mold film 1 is mounted in a tension hoop 3, such as is used to form drum heads and the like, under approximately uniform tension 2. The tension hoop with elastomeric film is stretched over the convex lens substrate 5 that has been coated with a thin layer of radiation curable polymer adhesive 4, at which time radiation 6 of appropriate wavelength to cause the adhesive 4 to solidify is applied through film 1. Radiation 6 can also be applied though lens 6, or through both, often depending on the optical transmission characteristics of each of said elements. Withdrawal of the tension hoop 3 results in the solidified polymer 4 now having a pattern complementary to that of mold film 1. It is preferable that polymer adhesive 4 is selected so as to have high adhesion to the substrate (5) and low adhesion to the mold (1). For example, the mold can be a silicone (PDMS) or polyurethane material, while the adhesive is a cationic or other radiation curable glass adhesive. It should be noted that the adhesive can be applied using slot-die coating, spin coating, ink jet application, or any other well-known suitable process, and may be applied to the substrate, the mold surface, or both.

Each of the two types of stretchable elastomeric mold films in this example have certain advantages, and may be used according to the material and pattern requirements. For example, the composite film approach has the advantage of being able to use materials as the mold layer that may not be capable of self-support due to low tear resistance, etc., where the elastomeric support film provides the required tear resistance. In addition, the patterning layer can also serve to planarize the substrate in cases where the substrate has an intrinsic surface roughness that would interfere with the molded pattern. However, the stretching properties of both the mold layer and the support film must be properly matched in order to eliminate the possibility of delamination fracturing of the composite film during stretching.

On the other hand, the integral (single material) stretchable elastomer mold film has the advantage of being simpler (1 layer), which allows the patterned surface to stretch uniformly along with the bulk substrate material without the possibility of delamination or fracture.

Figure 2:
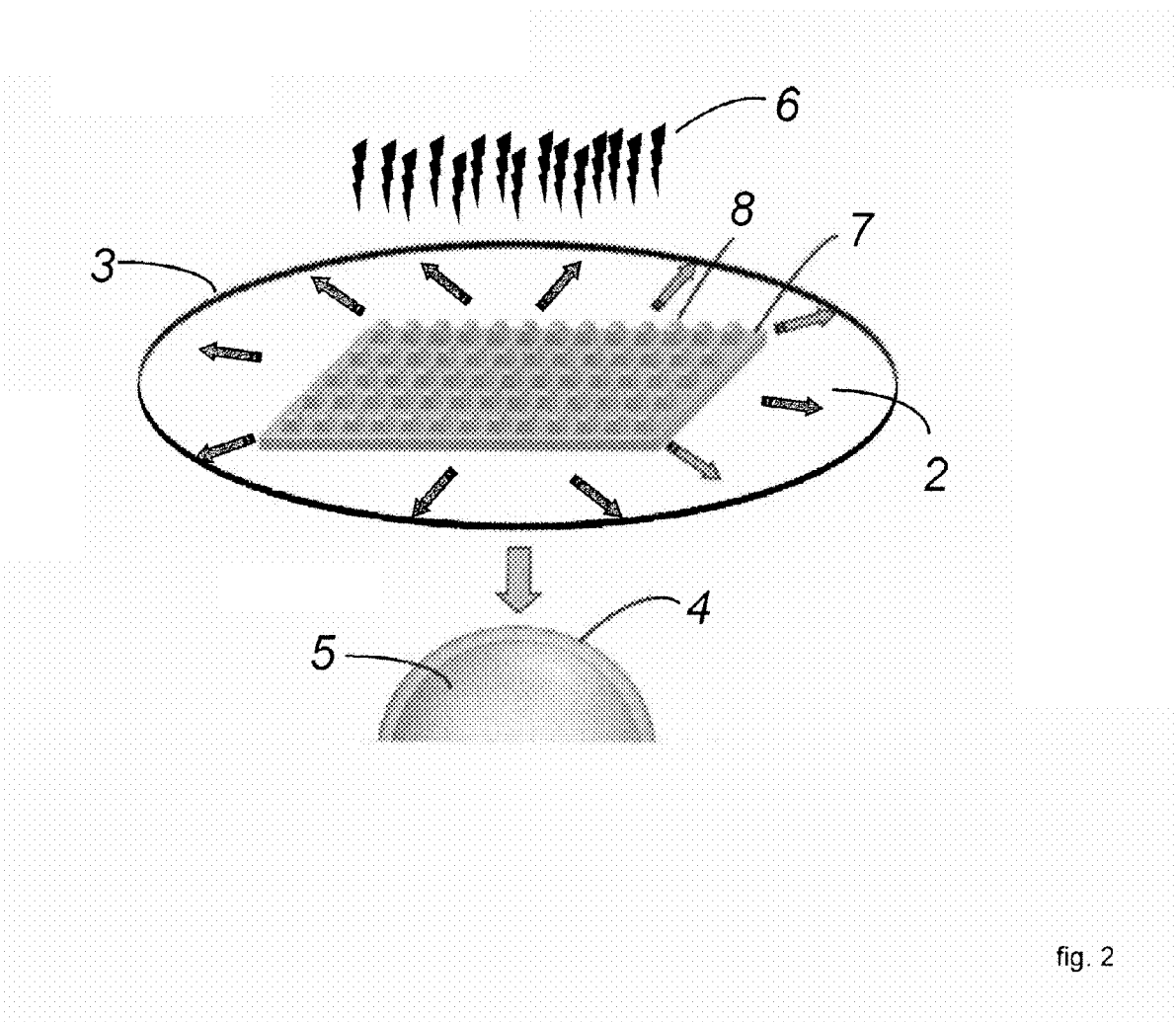
FIG. 2 depicts an patterned elastomeric film in tension hoop prior to bonding to substrate with compound curvature.

FIG. 2 shows another embodiment in which stretchable film 7 has a desired pattern 8 on one surface of planar surface of an (of elastomer material such as a polyurethane, silicone/PDMS, etc.). As in the previous example, this can be an integral or composite elastomeric substrate, but in this case the pattern 8 is formed on the outer surface of film 7 and has the final pattern rather than the complementary pattern. The film is mounted into circular tension hoop fixture 3 and is pulled over the surface of the convex lens 5, which has previously been coated with a thin layer of UV-curable adhesive 4, bringing it into conformal contact with the surface of the substrate. A UV radiation source 6 is used in this example to solidify the adhesive layer, although other types of adhesives may be used. Where the substrate is an optical lens, it is desirable that the transparency and index of refraction of the molding adhesive match that of the substrate as close as possible. Adhesive application may be carried out by spin coating, ink jet application, or any other well-known suitable process. The adhesive can also be applied to the back side surface of the elastomeric mold film, or both the film and substrate. With the adhesive applied, the tension hoop containing the elastomeric mold is pulled over the substrate. After curing, the mold is withdrawn, leaving the complementary pattern on the surface of the curved substrate.

In the above embodiment where the patterned elastomeric film is used as a replication mold, it will be seen that the replicating monomer material itself does not have to be elastomeric material, since when the mold is stretched the replicating polymer is in a liquid state and is not under tension and thus does not require elastomeric properties. This allows for the use of a broader range of replication materials with optimal physical properties (hardness, scratch resistance, etc.) for use as the pattern layer. The key required properties of the replicating material are that it adheres well to the substrate while not adhering to the elastomeric mold.

In yet another embodiment (not illustrated), the pattern is formed as a thin layer on a temporary elastomeric mold by any of the previously-mentioned means, including by chemical curing of a 1- or 2-part reactive material, where the thin pattern layer and the mold material have weak mutual adhesion (either by material selection based on intrinsic adhesion properties or use of a mold release). As in the previous examples, the film structure is stretched over the lens with the thin pattern layer facing the substrate and is then bonded to it using any of the previous described means. The temporary elastomeric carrier/mold is then removed, leaving the thin pattern layer bonded to the substrate with the pattern facing outward. This embodiment is useful when the film containing the pattern is very thin and/or prone to tearing. In addition, it allows use of desirable pattern-forming materials that may not otherwise adhere to the (lens) substrate, since the adhesive that bonds the film and substrate will provide the required substrate-to-pattern layer adhesion.

Figure 3:
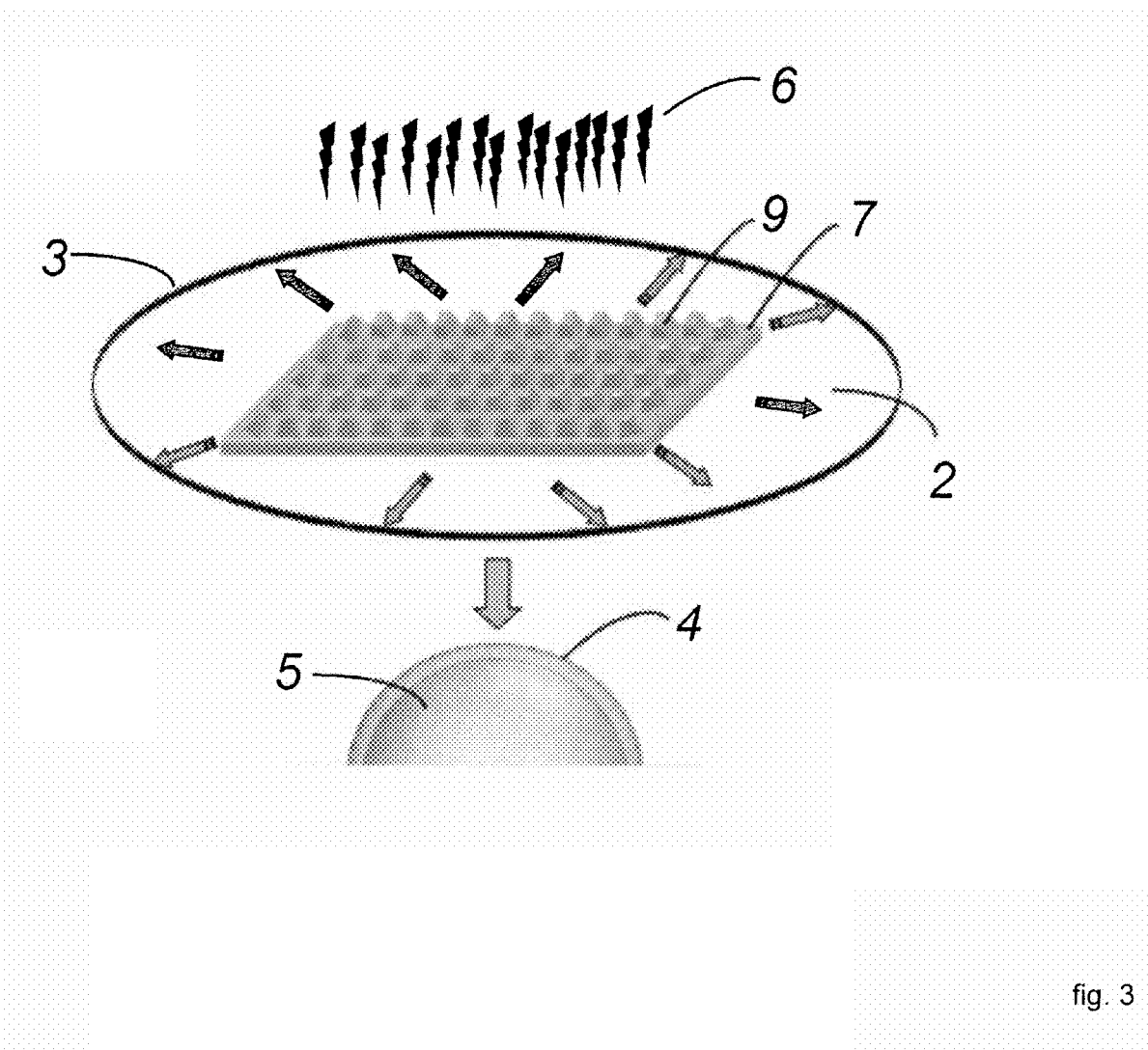
FIG. 3 depicts patterned elastomeric film with pre-distortion for pattern compensation in tension hoop prior to bonding to substrate with compound curvature.

The critical dimensions of many patterns, particularly those with nanoscale features, are generally very small relative to the curvature of the surface, thus the small degree of distortion introduced by the elastomeric stretching will generally be insignificant. However, in applications in which this distortion results in undesirable changes to the geometry of the pattern, structural changes resulting from the elastomeric distortion can be compensated for by "pre-distortion" in the master pattern: that is, alteration of the original geometry such that the pattern is rendered correctly when applied to the surface. This is shown in FIG. 3, in which pattern 9 on elastomeric film 7 has been modified in such a way as to form the correct pattern after it has been stretched in hoop 3 over lens 5 coated with bonding adhesive 4. It is therefore an aspect of the present invention to use this technique with the previously described elastomeric mold process (FIG. 1), the applied film process (FIG. 2), or any other approach described in this invention to compensate for elastic distortion of the pattern.

Figure 4:
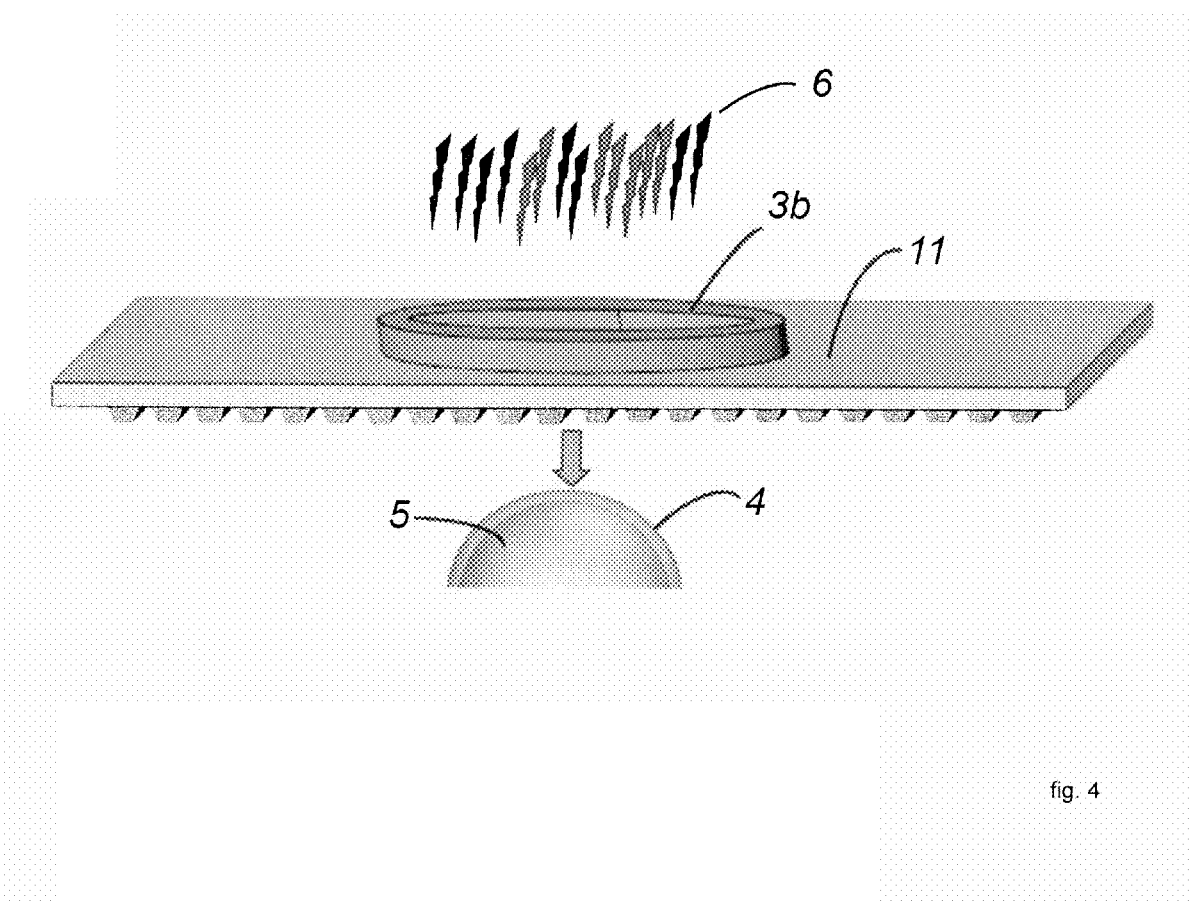
FIG. 4 depicts the application of roll-formed elastomeric mold to a curved substrate surface using tension hoop.

In another embodiment, shown in FIG. 4, an elastomeric film for molding or direct bonding can be formed by a roll-to-roll process when large quantities (and with the further benefit of lower costs) of patterned substrates are required. In this example, a section of a continuously patterned film 11 that has been formed in a roll-to-roll process (film transport not shown) is advanced from a supply spool with the patterned surface facing the substrate. A tension hoop 3b is used to press the film onto substrate 5 coated with replicating polymer adhesive 4, where the adhesive is then solidified by action of radiation 6. The hoop 3b along with mold film 11 is not retracted, leaving a layer complementary to the pattern of film 11 on the outer surface of substrate 5. The film can now be indexed to an unused section of film 11 to repeat the process on another substrate. This can be done in a step-and-repeat fashion or in a continuous fashion, where the engaged hoop and substrate move (on a conveyor belt fixturing assembly, for example) with the film. Depending on the durability of the mold film, the films may be used multiple times.

In another embodiment of the above example (not shown), the approach of FIG. 2 (direct bonding of patterned film) can be used in a continuous or step-and-repeat machine operation. In this case, after the patterned film is adhesively bonded to the substrate, the pattern is die-cut from the web.

Figure 5:
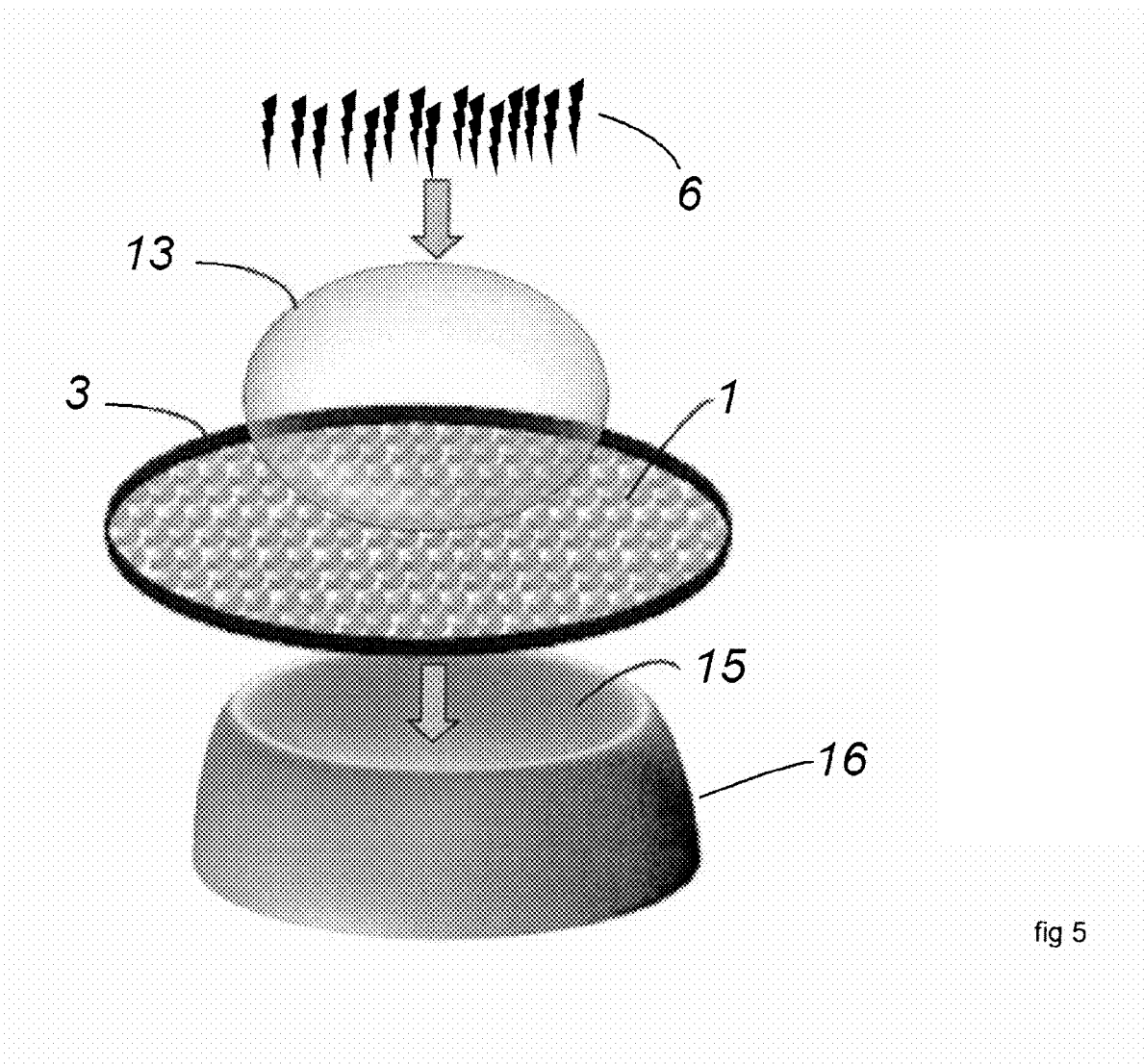
FIG. 5 depicts a method for application of patterned elastomeric film to a concave substrate surface using conformable compliance member.

FIG. 5 shows an example of the use of the present invention to form a pattern on a concave surface. Here, pressure is applied to a conformal material 13 (in this case an inflated bladder or balloon) to put the elastomeric film 1 in tension hoop 3 into conformal contact with the concave surface 15 of substrate 16. The conformable material 13 can be inflated using gas or hydraulic pressure, or can be a distortable solid (silicone or sand-filled ball, etc.). Elastomeric film 1 can be either a mold or a directly patterned film (using methods of FIGS. 1 and 2, respectively). In the case of the elastomeric mold (FIG. 1), the concave lens surface (or patterned surface, or both) is coated with a replicating polymer (not shown) and the tension-hooped mold is pressed against the substrate by pressure from member 13, and radiation is used to solidify the replicating polymer, after which the mold film is withdrawn by retraction of member 13. For the process of FIG. 2, the adhesive is a permanent adhesive to bond the film to the substrate, after which it is die cut from the tension hoop.

Figure 6:
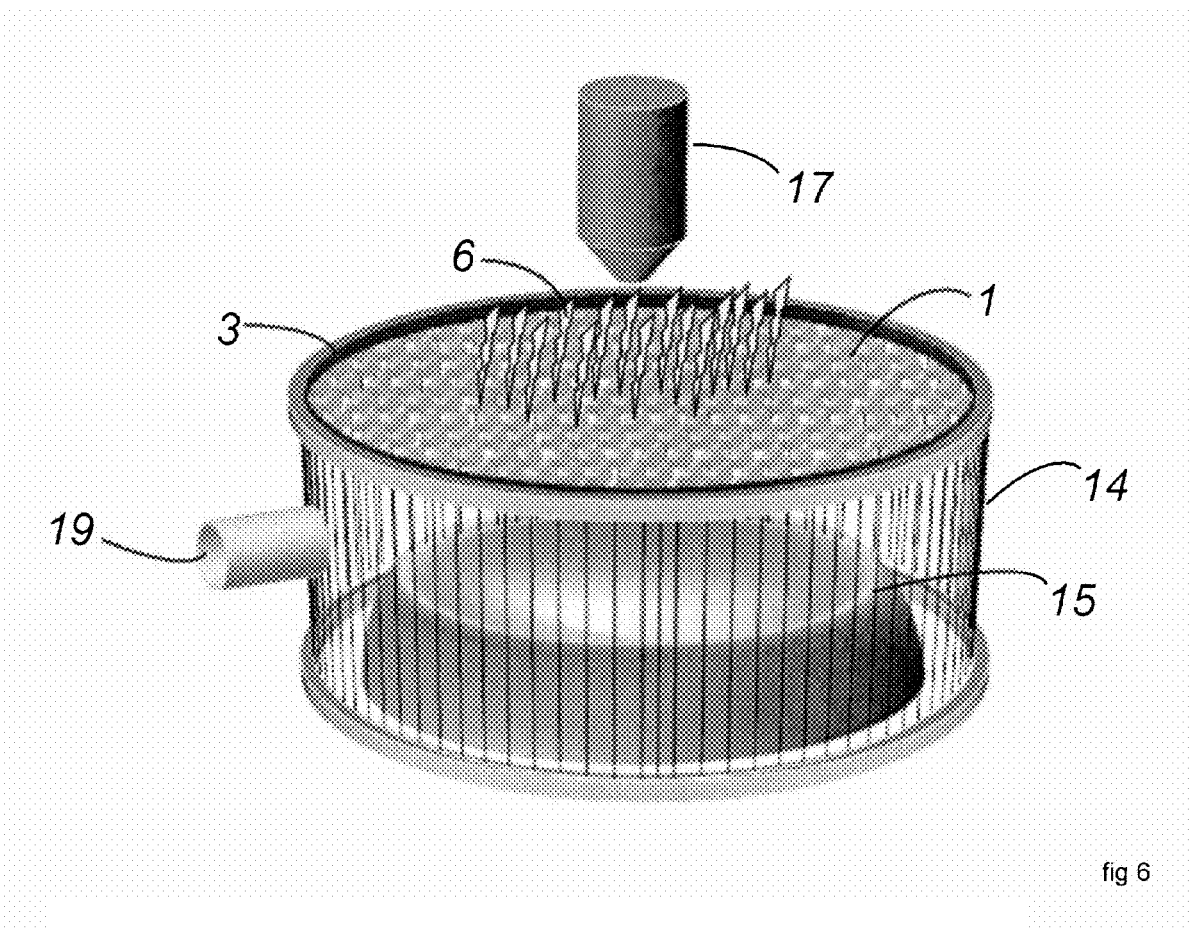
FIG. 6 depicts the use of a vacuum frame to produce contact between aa stretchable elastomeric mold and a concave surface prior to curing, with an (optional) tool for eliminating trapped air.

In yet another embodiment, shown in FIG. 6, mold film 1 in hoop 3 is configured to form part of a vacuum enclosure 14 (e.g., a bell-jar, bag, frame, etc.), inside of which substrate 15 is located. After applying the adhesive or replicating polymer adhesive (not shown), application of vacuum by exhausting air through port 19 causes the film mounted in the tension hoop to contact the substrate, at which time the adhesive is activated by application of actinic radiation 16 through either the transparent film 1 (as shown) or through the bottom side of the substrate (not shown). The effectiveness of the vacuum method can be enhanced if the vacuum enclosure is designed such that all frame surfaces other than the tension hoop holding the pattern film are rigid. Thus the only member that can move when the frame is evacuated is the pattern film. This can be further enhanced by adding additional pressure to the film surface outside of the vacuum frame, as shown in FIG. 5. It is another aspect of the present invention that the elastomeric film may be made to initially contact a single point on the concave surface resulting in the formation of a pathway for escape of any trapped to escape as the area of contact is increased.

Figure 7:
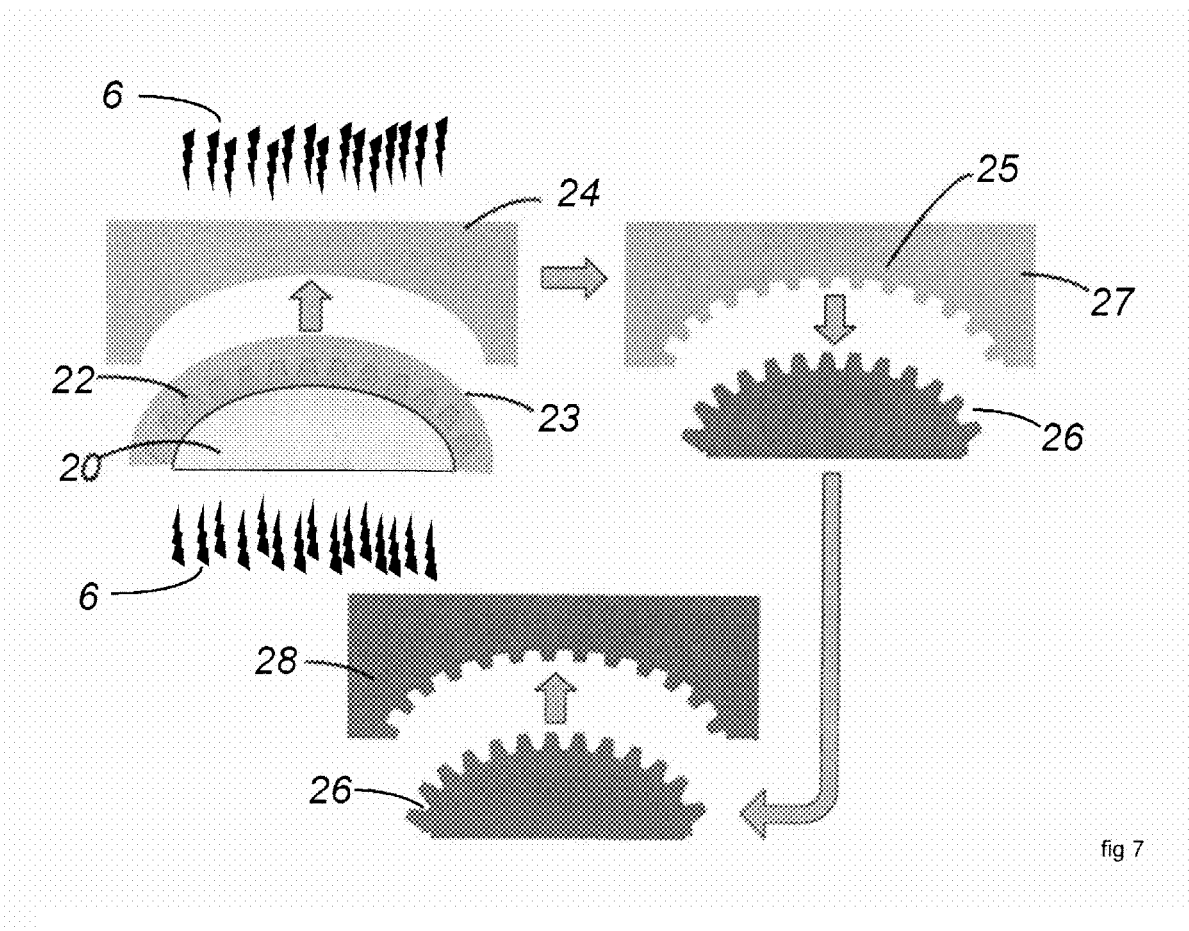
FIG. 7 depicts the formation of concave and convex cavity molds for patterning of compound curved surfaces and for forming durable, reusable molds.

FIG. 7 shows an embodiment of the invention for forming a rigid, reusable mold for patterning curved surfaces. Using any of the methods of the prior embodiments, substrate 20 with pattern 22 is formed. Transparent mold blank 24 is formed using conventional surface grinding technology. Molding adhesive layer 23 is the applied to the pattern (or to blank 24, or both, not shown), the pattern brought onto contact with blank 24, and radiation 6 is applied through the blank or the curved substrate so that layer 23 is solidified. After exposure and part separation, surface 25, having a pattern complementary to that of 22 is formed. Patterned mold 27 is used to form part 26, a replica of the original part (20+22) or a durable molding tool for making concave patterned replicas. Part 26 can be made as a durable tool by plating, such a Ni electroforming or electroless metal deposition, into cavity 27, where convex mold part 26 is formed after separation from mold 27. Part 26 can also be used to form durable tool 28, also by plating. Concave and convex molds (28 and 26, respectively), if formed using known Ni electroforming techniques, can be used multiple times to form patterned curved substrates using thermal (including injection molding), chemical reactive or radiation (through transparent substrate) molding techniques.

Figure 8:
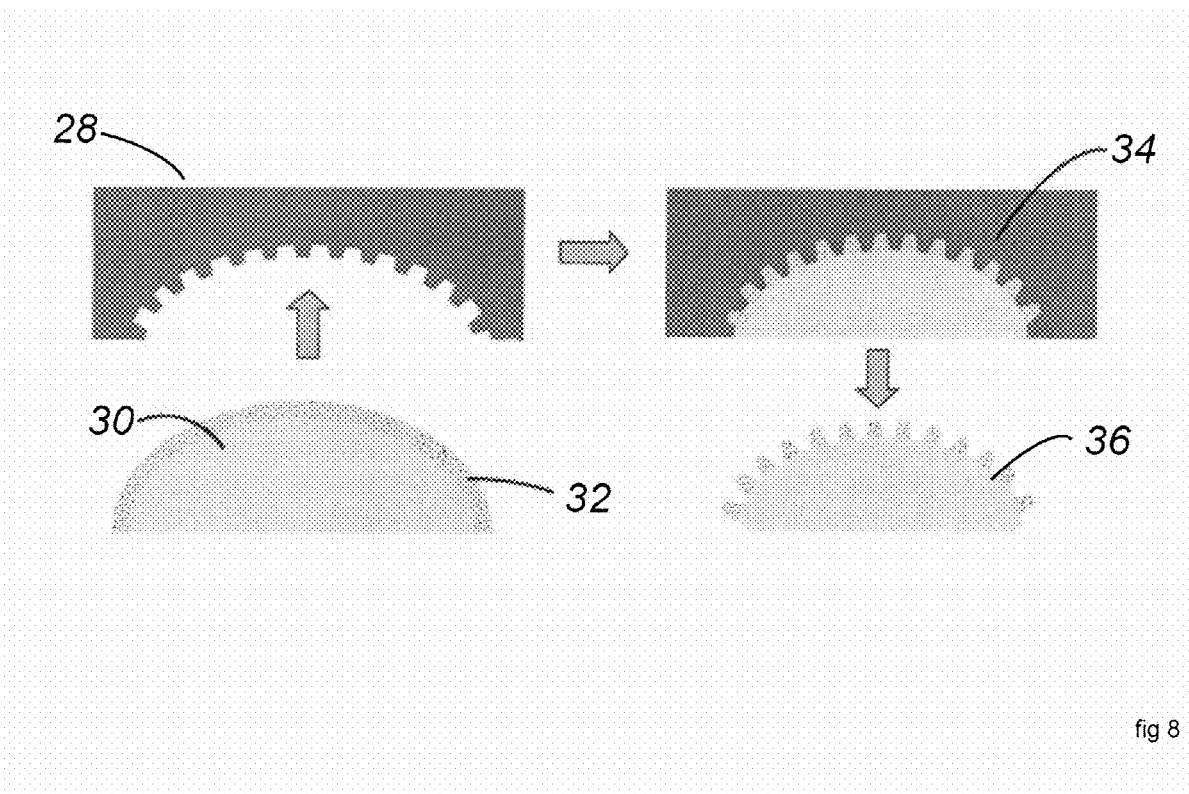
FIG. 8 depicts the patterning of convex surface using concave cavity mold.

FIG. 8 shows the use of durable concave mold 28 to pattern layer 32 coated on lens 30. After molding, convex patterned part 36 is extracted from mold 34. A similar process can be used with convex molds. For opaque (e.g., durable Ni) molds, radiation exposure is from the transparent substrate side, or can be accomplished by thermal or injection molding.

Figure 9:
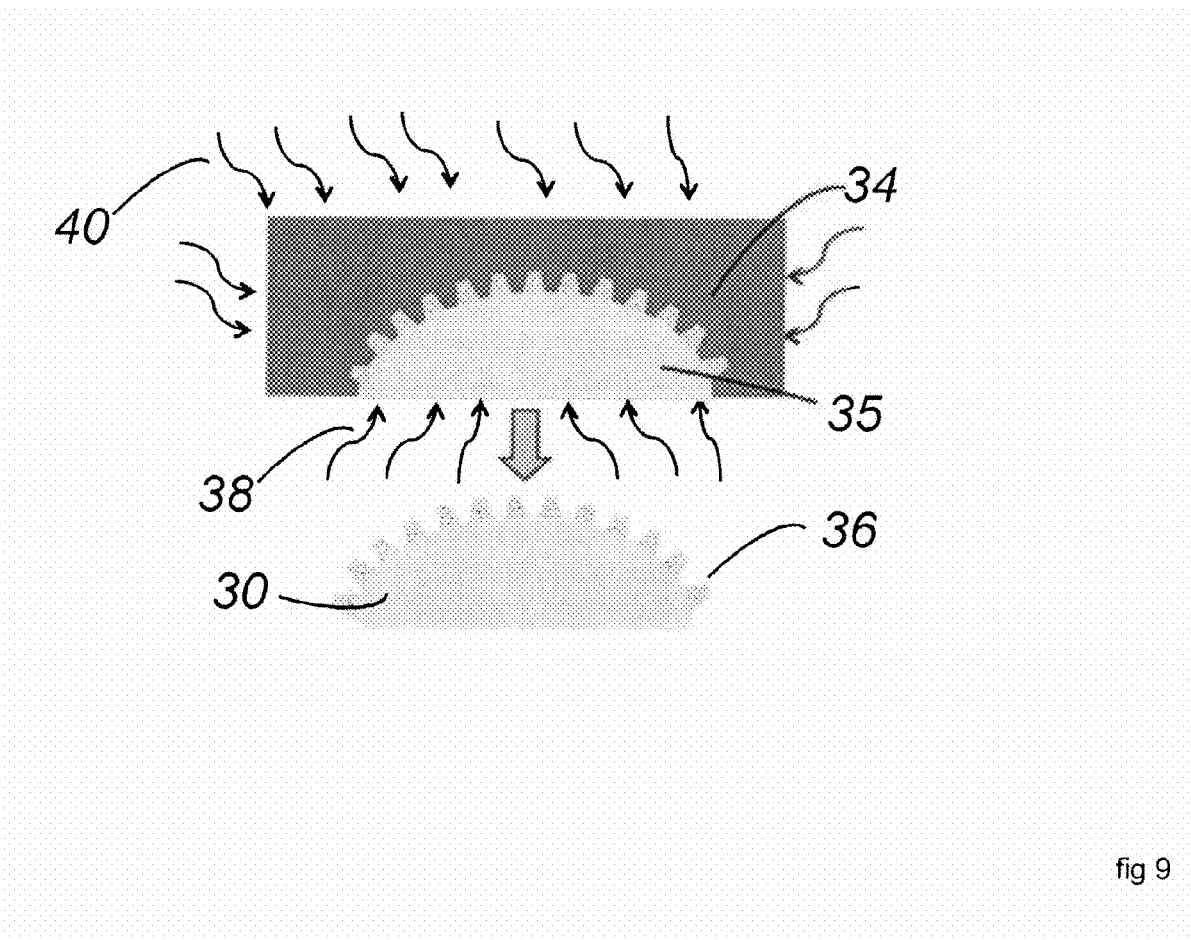
FIG. 9 shows a method for thermally-assisted separation of patterned surface from mold.

When the combination of substrate curvature, pattern geometry or rigid mold materials may result in damage to either the mold or the replica during separation, thermal assisted separation may be used to facilitate separation without damage (FIG. 9). Here, either mold 34 is heated (40) or the replica part 35 is chilled (or both) in order to utilize differential thermal expansion and/or contraction to allow separation of part 36. Because the height of the patterns are typically very small compared to the substrate, very little dimensional change (temperature differential) is required to allow separation by this method.

It is another objective of the present invention to describe methods for forming useful patterns of metals, alloys, inorganic/dielectric materials or multi-layer thin films on compound curved surfaces. Such patterns may include electrical wires or electric circuits and elements, transparent electrically conductive meshes or grid patterns, wire-grid polarizer patterns, meta material structures, beam splitters, zone plates, touch screen patterns, photomasks, etc.

To create metal or dielectric patterns, a polymeric mask is formed on the surface of the substrate, using the previously described methods for forming polymer structures. In this case, the structure is used as a pattern forming mask, similar in function to a photoresist mask used in lithography, to form the desired metal or dielectric pattern by subtractive (material removal) or additive (material deposition) processing.

Figure 10:
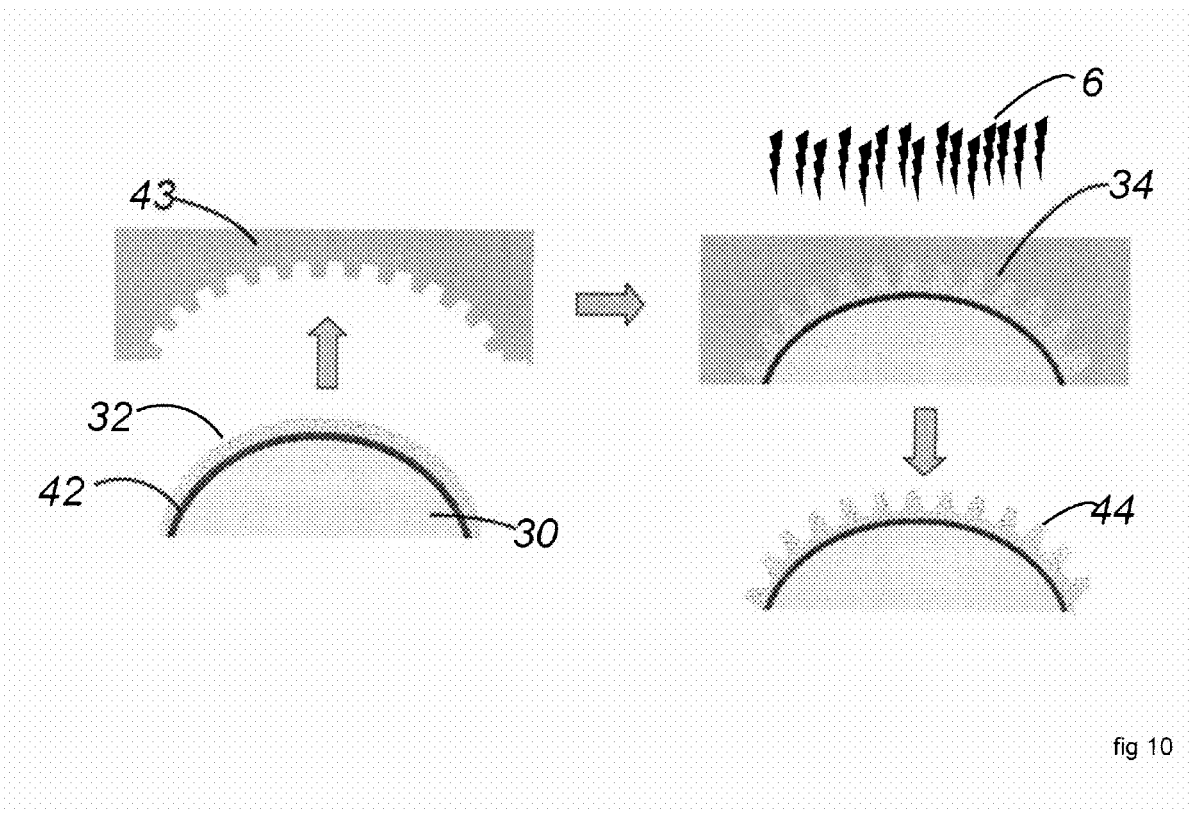
FIG. 10 shows the formation of an etch mask for subtractive patterning on a convex surface.

In the example shown in FIG. 10, metal layer 42 is deposited by vacuum or other deposition means (including electroplating or electroless plating) on the lens or curved surface 30 to be patterned. Next, using the imprinting embodiment described earlier (FIG. 7), polymeric pattern 44, pre-distorted if necessary, is formed over the metal layer. In this example transparent mold 43 is used to solidify layer 32, but the methods of FIG. 1 (elastomeric mod patterning) can also be used to form the mask.

Figure 11:
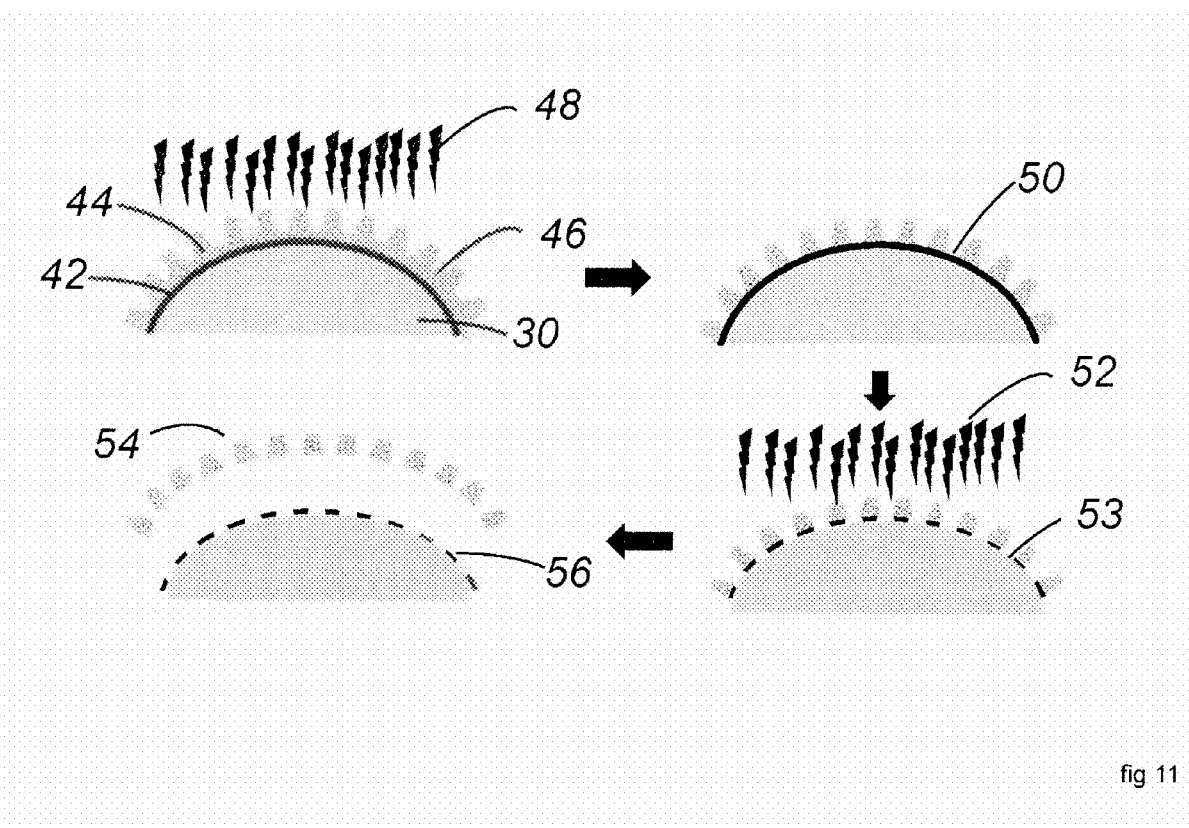
FIG. 11 is a schematic depiction of the formation of a metal or dielectric pattern on a convex surface by subtractive etch mask patterning.

As shown in FIG. 11, imprinted polymer layer 46 acts as a resist etch mask for transfer of the pattern of the mask to the metal layer by first removing any polymer residue layer ("scum", 46) that might be in the bottoms of the imprinted mask (44) by plasma etching (48), this "descum" process being well known in the field of photolithography. This exposes and cleans the surface of the substrate 50 under the imprinted mask. In a subsequent step, the de-scummed polymer mask is used in conjunction with either wet chemical etching or plasma etching (52) to selectively remove the areas of the metal layer (53) exposed through the mask openings. The mask may then be removed (54), by chemical treatment ("lift off"), plasma etching or mechanical means, to expose the metal pattern on the surface of the substrate. In some cases, the transparent mask may be left in place as a protective coating over the pattern.

Patterns thus formed could be, for example, as wire grid polarizers, transparent conductors, clear-field or dark-field photomasks, etc. A photomask formed in this manner can be used to expose a photoresist-coated substrate of matching curvature to form a mask on said substrate. Although the example given in FIG. 11 shows the patterning of a convex surface, the analogous process can be used to form an etch mask pattern on a concave substrate, using techniques described earlier.

By the above methods, metal layers, inorganic layers, transparent conductors such as indium tin oxide (ITO), etc., and multilayer stacks such as anti-reflection layers, etc. can be patterned.

In yet another embodiment (not shown), a mask formed by the above process is used to additively form a metal or inorganic pattern on a concave or convex curved surface. In this process the polymer mask is formed directly on the substrate and the mask is then de-scummed, after which the material to be patterned (metal, inorganic) is deposited over the entire masked area. Lift-off of the mask along with excess deposited material produces the desired pattern.

Figure 12:
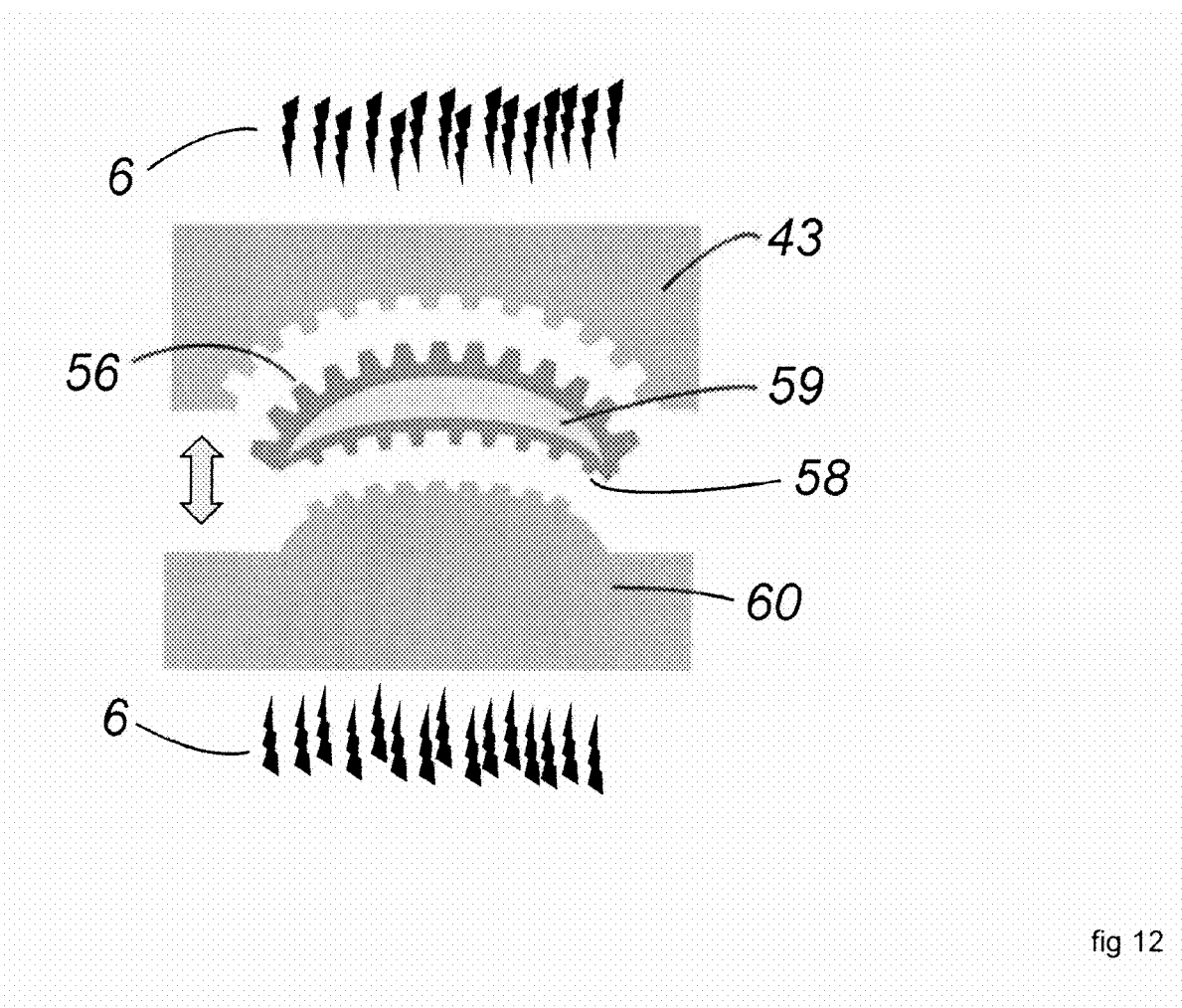
FIG. 12 is a schematic depiction of the formation of patterns on two sides of a compound curved substrate.

It is another aspect of the present invention to combine of any of the techniques of the present invention to pattern both sides of a curved surface or lens, such as a bi-concave, bi-convex, concave-convex, or plano-concave/convex lens. An example of a dual-sided concave-convex lens patterned this way is given in FIG. 12, where transparent molds 43 and 60 are used to form patterns 56 and 58, respectively, on substrate 59. In this case, radiation 6 is used to solidify the molding material.

Figure 13:
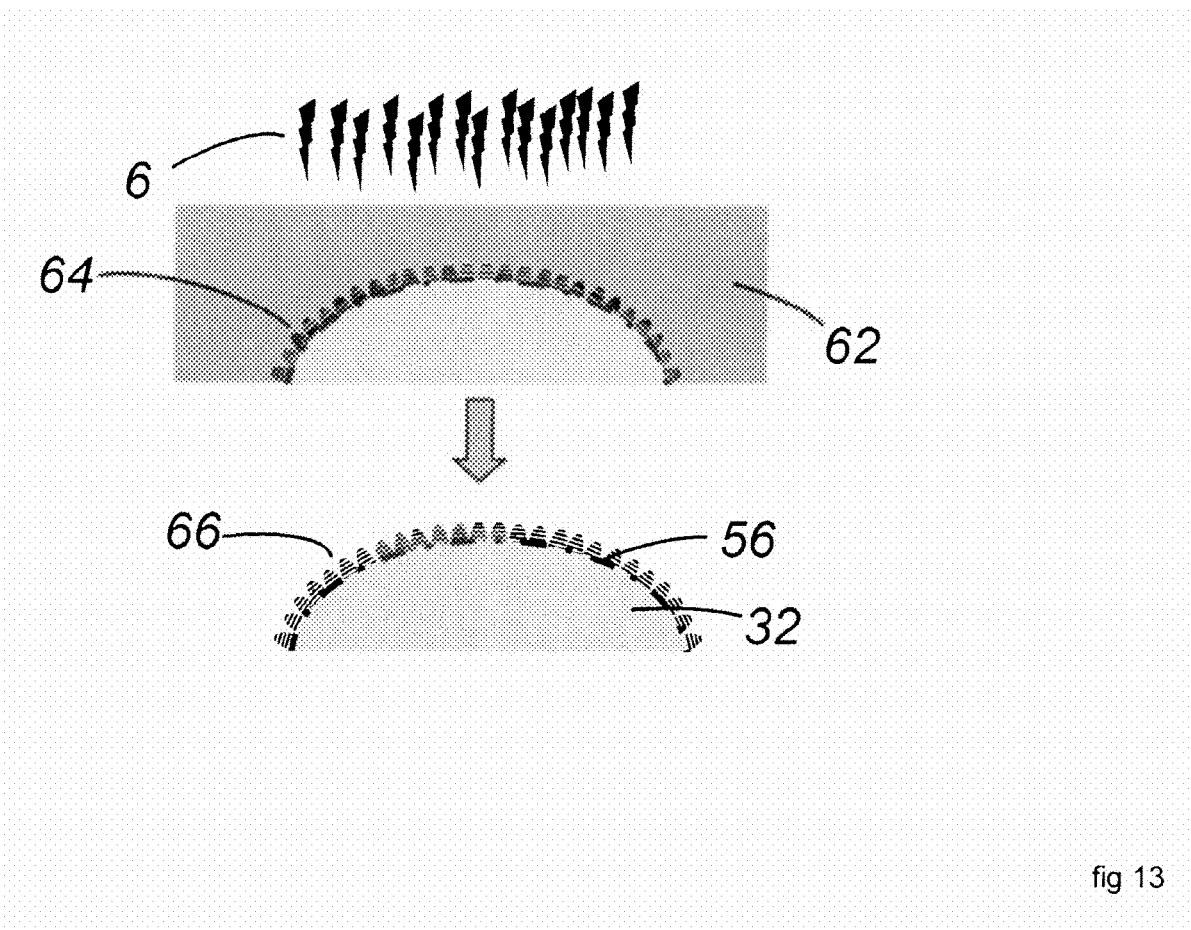
FIG. 13 illustrates the formation of combined metal/dielectric pattern with a molded optical pattern.

Another embodiment of the present invention combines a molded optical pattern (such as a diffractive, binary or holographic structure, etc.) with a patterned metallic or dielectric pattern to allow surfaces to benefit from both types of patterns. This could include, for example, a motheye or diffractive pattern combined with a transparent conductive grid. One such example is illustrated in FIG. 13, where a patterned metal (or dielectric, etc.) layer (e.g., 56 in FIG. 11) is first formed, then mold 62 with pattern 64 is used to form pattern 66 over previously-formed metal pattern 36 on substrate 32. Again, the tension hoop pattern molding method for FIG. 1, etc., can also be used to form the metal pattern 56 and optical pattern 66.

Dual-sided patterning, described earlier, can be used in various combinations, such as one side having a molded pattern and the other having a metallic or dielectric pattern, or any useful combination of dual patterns on both sides of a curved substrate or lens.

Figure 14:
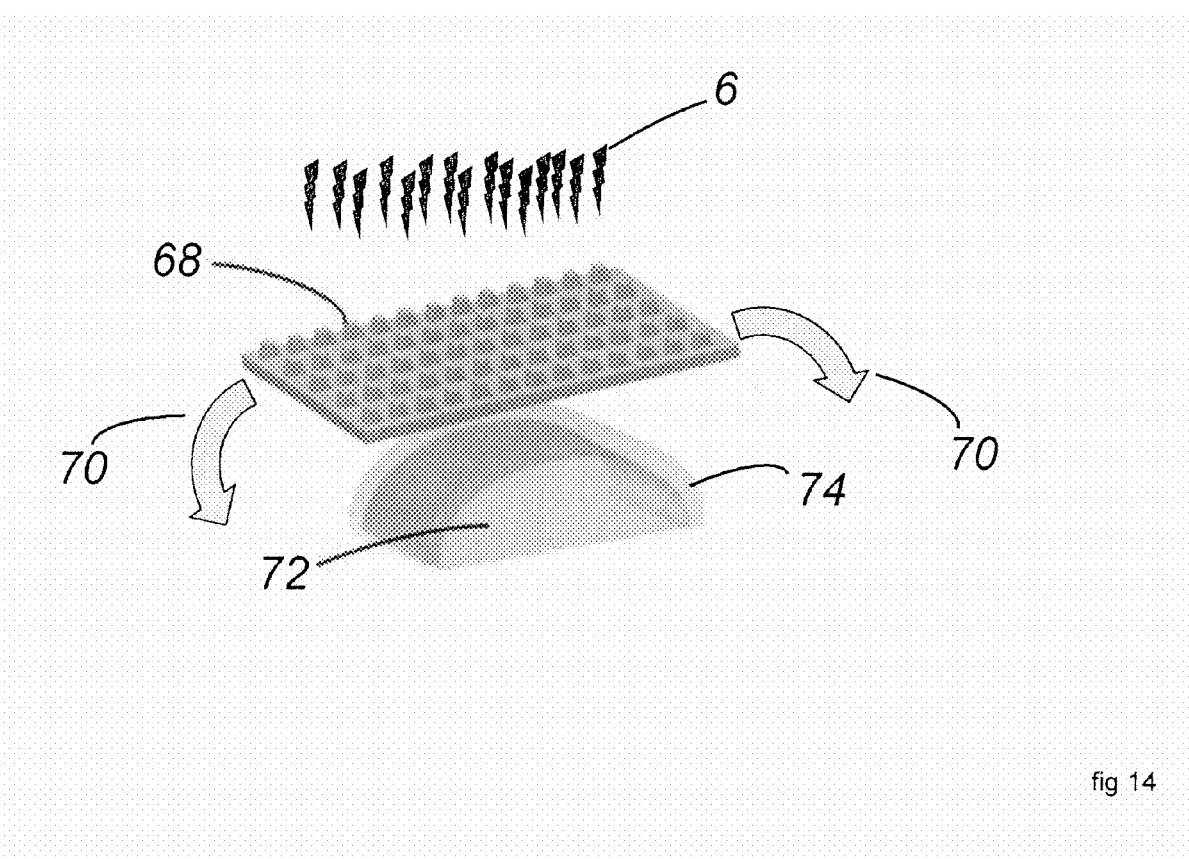
FIG. 14 is a schematic depiction of the formation of a pattern on convex cylindrical surface using a bonded flexible film.
Figure 15:
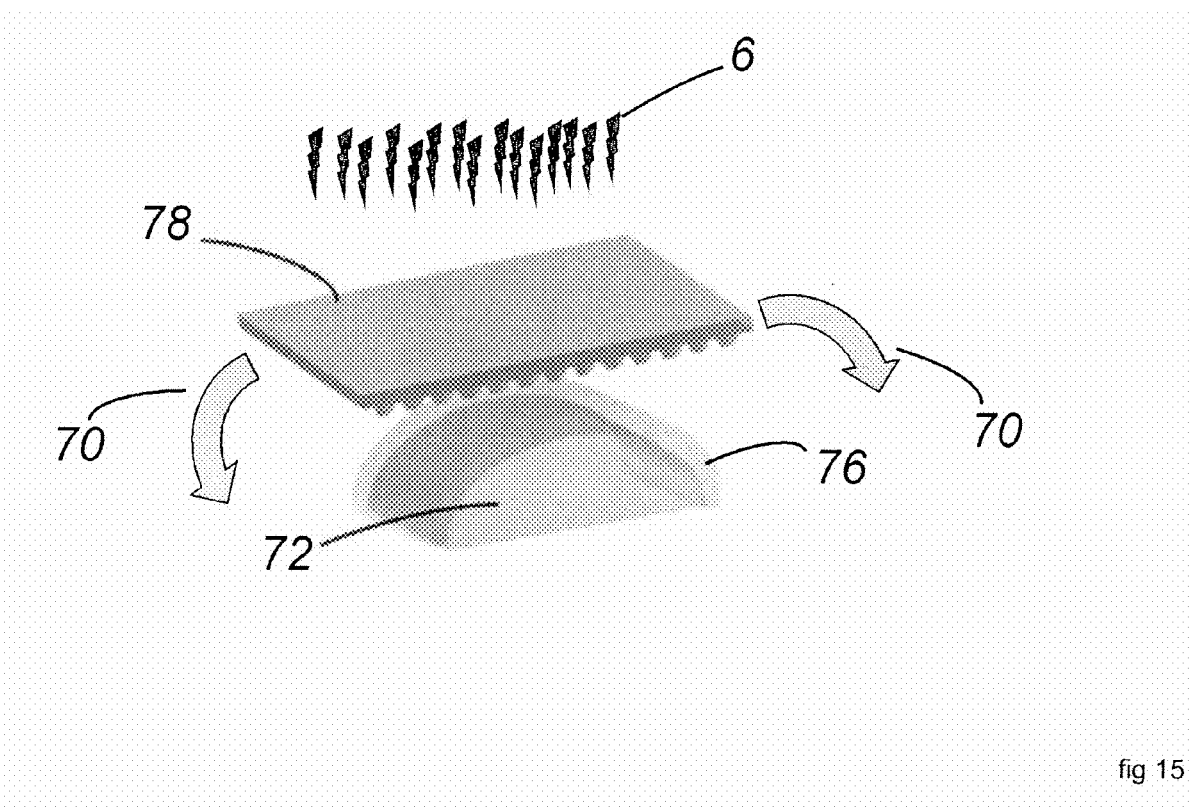
FIG. 15 depicts the formation of a pattern on convex cylindrical surface using a flexible film stamp.

The techniques of the present invention can also be applied in the simpler case of cylindrically curved surfaces, where only one axis of curvature exists. In this case, the film used to form the pattern must be flexible but does not have to also be stretchable (elastomeric), thereby allowing the use of films such as polyethylene phthalates (PET, etc.), polycarbonates, polyimides, flexible glass or metal foils. FIGS. 14 and 15 illustrate this process for replication molds and bonded films, respectively. A further embodiment. Shown in FIG. 14 is a schematic of a process in which a patterned film 68 is pulled under tension (70) against adhesive-coated layer 74 of convex cylindrical surface 72 to provide a pattern layer over the substrate, analogous to the process in FIG. 2. FIG. 15 illustrates the process analogous to FIG. 1 in which flexible member 78 is pulled under tension (70) over substrate 74 coated with replication polymer 72, where the replication polymer is solidified by radiation 6 through transparent film 78.

Figure 16:
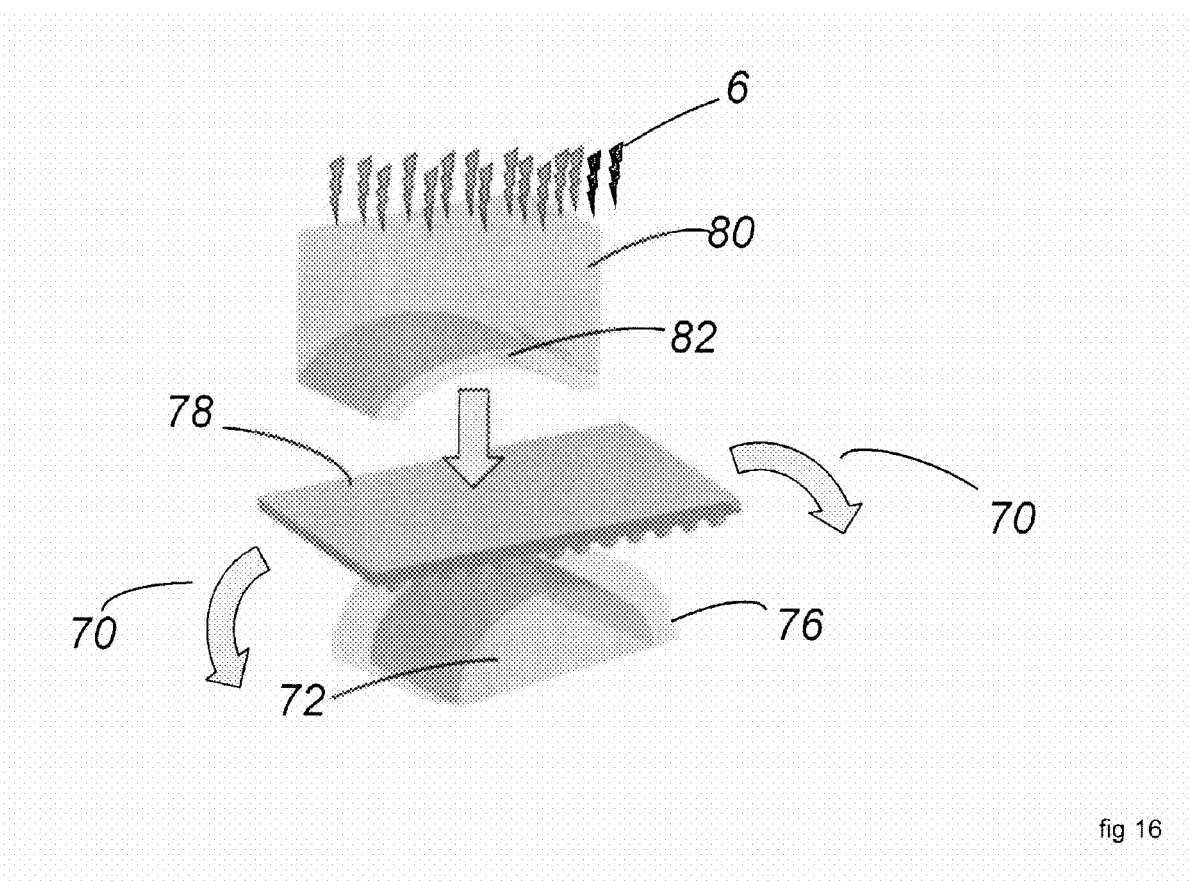
FIG. 16 shows the formation of a pattern on convex cylindrical surface using flexible film stamp with curved compliance backing member.

In another embodiment of the example in FIG. 15, in FIG. 16 is shown block 80, with curvature matching that of the cylindrical substrate, which is used to add additional pressure on mold film 78 from that provided by film tension 70. This allows uniform pressure to be applied to assure uniform monomer thickness. The block may also include an elastomeric surface 82 to allow additional compliance to the mold. Block 80 and compliant layer 82 are transparent in this case in order to pass radiation 6 that solidifies layer 76 on substrate 72. The curvature of block 80 and layers 82 and 78 can be adjusted to closely match that of 7 substrate 72 (with layer 76).

Figure 17:
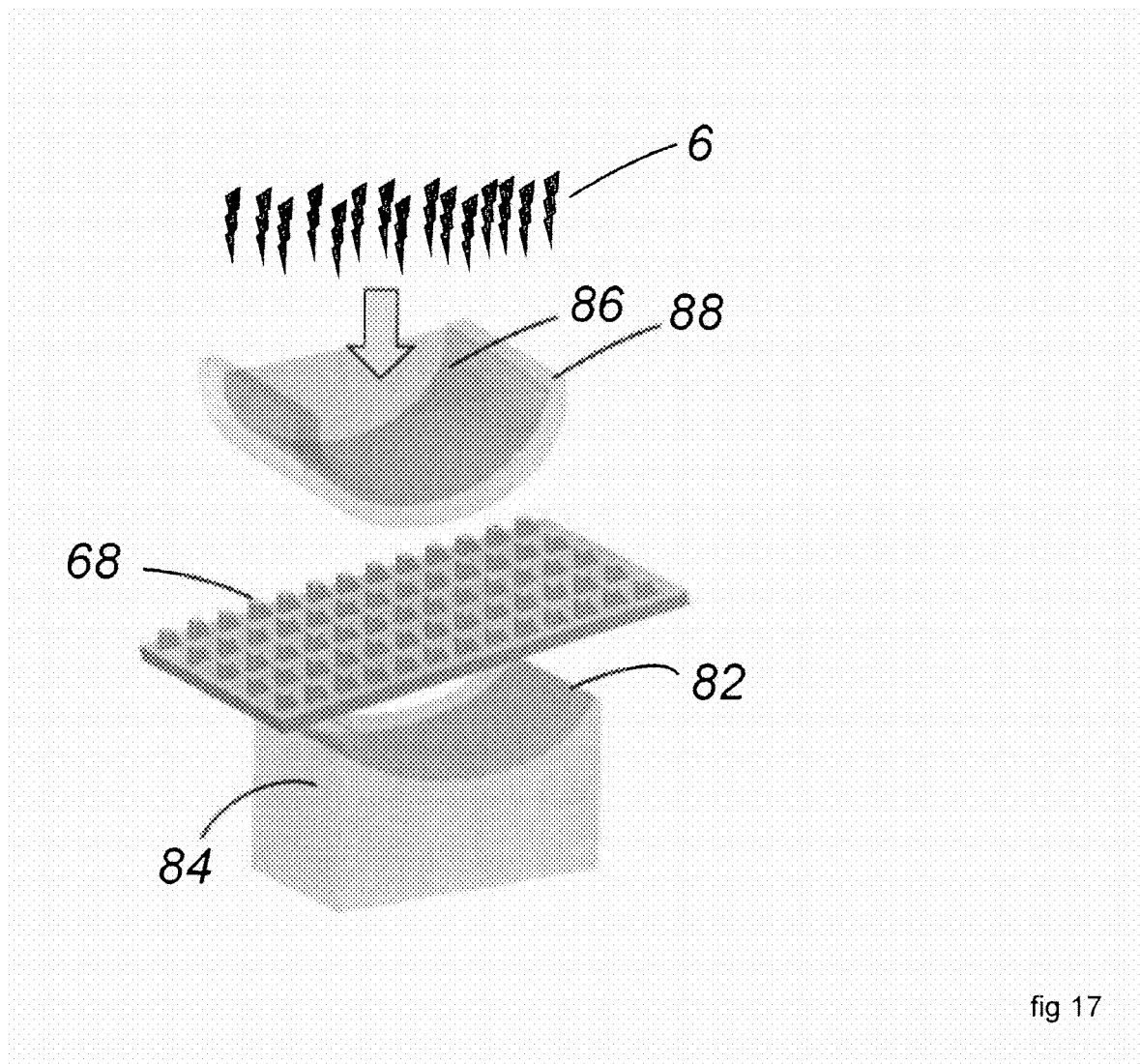
FIG. 17 illustrates the formation of a pattern on concave cylindrical surface using flexible film stamp and curved compliance backing

FIG. 17 shows a similar process as above, but in this example the surface to be patterned 86 is convex and corresponding block 84 with compliant layer 82 is concave in shape. The thickness of the film and adhesive layer 88 may again need to be taken into account when determining the curvature of the compliant blocks. In this example, an flexible mold film is placed into contact with replica layer 88, and radiation source 6 used to solidify the pattern.

Figure 18:
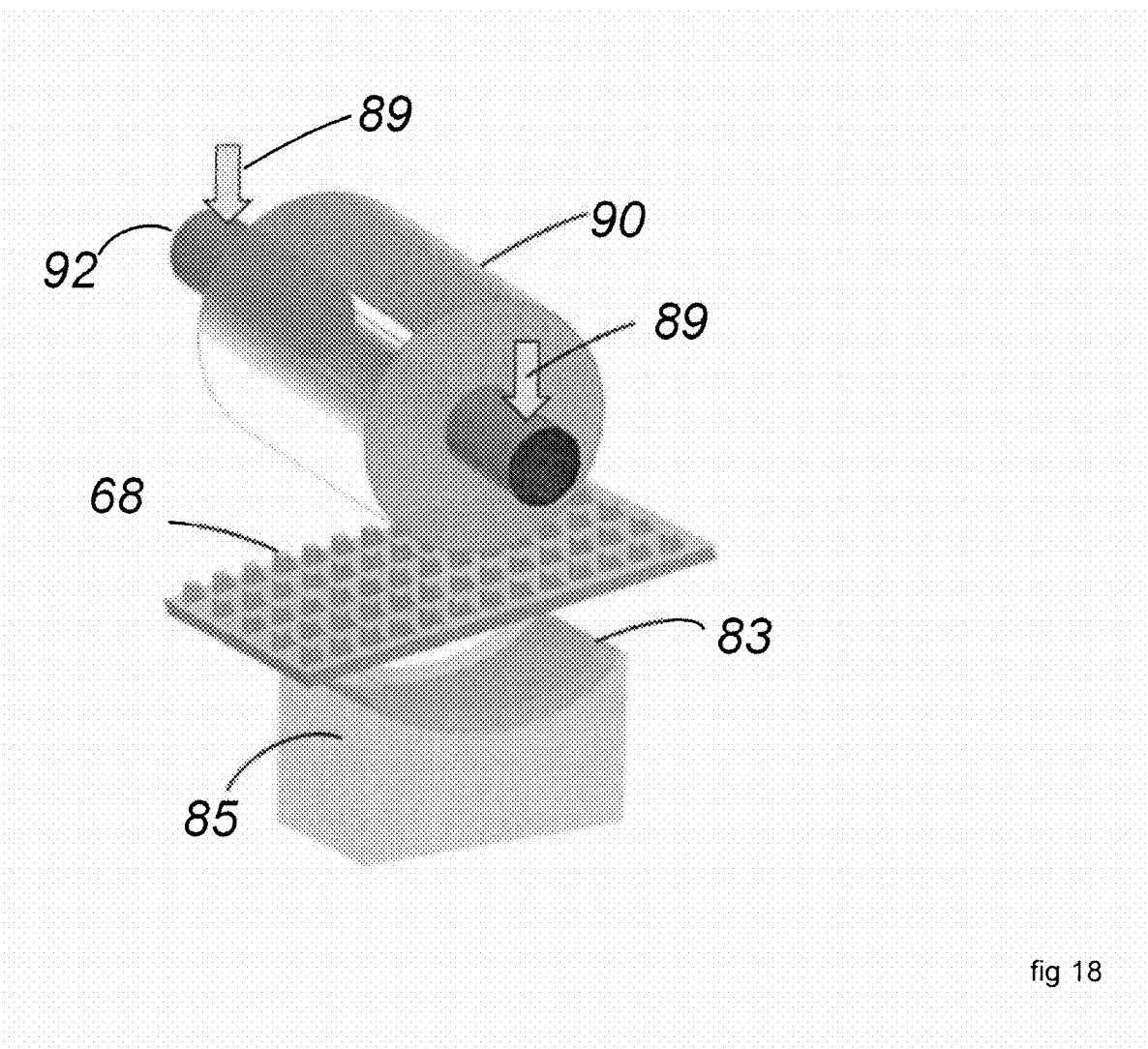
FIG. 18 illustrates the formation of a pattern on concave cylindrical surface using flexible film stamp with elastomeric roller.

FIG. 18 shows an example of the application of patterned flexible film 68 to concave substrate 85 using adhesive layer 83. In this case pressure is applied through force 89 to shaft 92 of elastomeric roll 90.

It should be noted that, similar to the examples for compound curved substrates shown in FIGS. 7-13, cylindrical molds can be used to replicate patterns on concave and convex cylindrical substrates The methods of forming patterns on compound curved surfaces of the present invention are expected to find use in low cost improved optics, sensors, electronic circuits and displays.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and advantages. These also include embodiments in which the components and/or steps are arranged and/or ordered differently.

For example, while certain exemplary assignment protocols are described above, others may be used within the scope of the present disclosure.

Unless otherwise indicated, the servers, systems, and software modules that have been discussed herein are implemented with a computer system configured to perform the functions that have been described herein for the component. Each computer system includes one or more processors, tangible memories (e.g., random access memories (RAMs), read-only memories (ROMs), and/or programmable read only memories (PROMS)), tangible storage devices (e.g., hard disk drives, CD/DVD drives, and/or flash memories), system buses, video processing components, network communication components, input/output ports, and/or user interface devices (e.g., keyboards, pointing devices, displays, microphones, sound reproduction systems, and/or touch screens).

If used, each computer system may be a desktop computer or a portable computer, such as a laptop computer, a notebook computer, a tablet computer, a PDA, a smartphone, or part of a larger system, such a vehicle, appliance, and/or telephone system.

A single computer system may be shared by various components/steps of the methods described herein.

Each computer system may include one or more computers at the same or different locations. When at different locations, the computers may be configured to communicate with one another through a wired and/or wireless network communication system.

Each computer system may include software (e.g., one or more operating systems, device drivers, application programs, and/or communication programs). When software is included, the software includes programming instructions and may include associated data and libraries. When included, the programming instructions are configured to implement one or more algorithms that implement one or more of the functions of the computer system, as recited herein. The description of each function that is performed by each computer system also constitutes a description of the algorithm(s) that performs that function.

The software may be stored on or in one or more non-transitory, tangible storage devices, such as one or more hard disk drives, CDs, DVDs, and/or flash memories. The software may be in any suitable programming language and may include source code and/or object code format and/or executable code. Associated data may be stored in any type of volatile and/or non-volatile memory. The software may be loaded into a non-transitory memory (e.g., computer-readable medium) and executed by one or more processors.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

What is claimed is:

1. A method for fabricating a pattern on a compound curved surface, said method comprising:
   a. forming a relief pattern on a stretchable surface to form a replication mold,
   b. coating a layer of curable polymer material on said stretchable surface,
   c. causing said coated stretchable surface to come in conformal compliant contact with a curved substrate
   d. exposing said curable polymer material to radiation to cause solidification of said polymer material,
   e. withdrawing said stretchable mold from contact with said substrate so as to leave the solidified polymer having a pattern complementary to that of the relief pattern of the stretchable replication mold as a layer on the surface of said substrate.

2. The method of claim 1 in which the substrate is a lens.

3. The method of claim 1 in which the substrate is concave or convex.

4. The method of claim 1 in which the substrate is comprised of two or more curved surfaces.

5. The method of claim 1 in which the curable polymer material is applied to the substrate, the replication mold, or both.

6. The method of claim 1 in which the polymer material relief pattern is used as a resist mask.

7. The method of claim 5 in which the resist mask is used to form a pattern in an underlying material layer by etching of said underlying material.

8. The method of claim 5 in which a material layer is deposited over said pattern-forming mask followed by removal of said mask and excess deposited said material to result in the formation of a desired pattern in said material.

9. The methods of claims 7 or 8 in which the material layer is comprised of one or more metals, alloys, dielectrics or combinations thereof.

10. The methods of claims 7 or 8 in which the pattern formed in said material layer comprises a transparent conductive grid or circuit.

11. The method of claim 1 in which conformal compliance between the stretchable mold and a convex substrate is accomplished by stretching a tension hoop mounted with said stretchable mold over said convex substrate.

12. The method of claim 1 in which conformal compliance between the stretchable mold and a concave substrate is accomplished by pressing a compliant elastomeric member against the backside of said stretchable mold mounted in a tension hoop.

13. A method for fabricating a pattern on a compound curved surface, said method comprising:

a. forming a relief pattern on a stretchable surface to form a replication mold,
b. coating a layer of curable polymer material onto the relief pattern of said stretchable replication mold,
c. solidifying said layer of polymer material,
d. causing the surface of said solidified polymer layer on said stretchable surface to come into conformal compliant contact with a curved substrate
e. using an adhesive to adhere said solidified polymer layer to said curved substrate,
f. separating said stretchable replication mold from said solidified layer of polymer material so as to leave the solidified polymer having a pattern complementary to that of the relief pattern of the stretchable replication mold as a layer on the surface of said substrate.

14. A method for fabricating a pattern on a compound curved surface, said method comprising:
a. forming a relief pattern on a stretchable surface,
b. causing said coated stretchable surface to come in conformal compliant contact with a curved substrate
c. Using an adhesive to bond the backside of said curable polymer material to a curved substrate.

15. The method of claim 14, further comprising using an applied vacuum to produce conformal compliance between the stretchable mold and substrate.

16. The method of claim 14, wherein the pattern is a moth-eye antireflection pattern.

17. The method of claim 14, wherein the relief pattern on said stretchable replication mold is pre-distorted to compensate for changes in geometry caused by bringing said mold into conformal compliance with said curved substrate.

18. The method of claim 13, wherein the pattern is a transparent electrically conductive grid.

19. The method of claim 13, wherein the stretchable replication mold is separated from the solidified layer of polymer material using differential thermal expansion and/or contraction.

* * * * *